(12) United States Patent
Zhang et al.

(10) Patent No.: US 11,795,537 B2
(45) Date of Patent: Oct. 24, 2023

(54) MASK ASSEMBLY, METHOD FOR MANUFACTURING THE SAME, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Guomeng Zhang, Beijing (CN); Fengli Ji, Beijing (CN); Yan Huang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 6 days.

(21) Appl. No.: 17/355,227

(22) Filed: Jun. 23, 2021

(65) Prior Publication Data
US 2021/0395873 A1    Dec. 23, 2021

(30) Foreign Application Priority Data

Jun. 23, 2020 (CN) .......................... 202010582174.9

(51) Int. Cl.
| | | |
|---|---|---|
| *C23C 14/04* | (2006.01) | |
| *C23C 14/24* | (2006.01) | |
| *B05C 21/00* | (2006.01) | |
| *H10K 71/16* | (2023.01) | |

(52) U.S. Cl.
CPC .......... *C23C 14/042* (2013.01); *B05C 21/005* (2013.01); *C23C 14/24* (2013.01); *H10K 71/166* (2023.02)

(58) Field of Classification Search
None
See application file for complete search history.

(56) References Cited

U.S. PATENT DOCUMENTS

| | | | | |
|---|---|---|---|---|
| 7,694,648 | B2* | 4/2010 | Kim | H01L 51/0011 |
| | | | | 313/402 |
| 9,711,724 | B2* | 7/2017 | Baek | H01L 51/0011 |
| 9,748,485 | B2* | 8/2017 | Lee | C23C 14/24 |
| 10,083,997 | B2* | 9/2018 | Kim | H01L 51/0011 |
| 10,224,350 | B2* | 3/2019 | Kim | H01L 27/1288 |
| 10,711,338 | B2* | 7/2020 | Kawato | H01L 51/001 |
| 10,787,729 | B2* | 9/2020 | Bai | C23C 14/042 |
| 10,818,877 | B2* | 10/2020 | Hong | H01L 27/3223 |
| 11,075,340 | B2* | 7/2021 | Shin | H01L 51/0097 |

(Continued)

FOREIGN PATENT DOCUMENTS

| | | |
|---|---|---|
| CN | 1586013 A | 2/2005 |
| CN | 207159336 U | 3/2018 |
| JP | 2016011438 A | 1/2016 |

OTHER PUBLICATIONS

First office action of Chinese application No. 202010582174.9 dated Dec. 8, 2021.

*Primary Examiner* — Jethro M. Pence
(74) *Attorney, Agent, or Firm* — Lippes Mathias LLP

(57) ABSTRACT

Provided is a mask assembly, including at least n evaporation masks, n being an integer greater than 2, wherein the at least n evaporation masks have a same width and the at least n evaporation masks respectively correspond to n types of display panels with different sizes, the width matching the n types of display panels with different sizes.

15 Claims, 6 Drawing Sheets

(56) References Cited

U.S. PATENT DOCUMENTS

| | | | | |
|---|---|---|---|---|
| 11,136,663 B2* | 10/2021 | Kim | | C23C 14/042 |
| 11,214,858 B2* | 1/2022 | Jin | | C23C 14/042 |
| 11,227,839 B2* | 1/2022 | Du | | H01L 27/1262 |
| 11,396,693 B2* | 7/2022 | Bai | | B05C 21/005 |
| 11,421,314 B2* | 8/2022 | Lee | | H01L 51/0011 |
| 11,444,130 B2* | 9/2022 | Tan | | C23C 14/042 |
| 2007/0187846 A1 | 8/2007 | Kang et al. | | |
| 2015/0102329 A1* | 4/2015 | Lee | | H01L 51/0011 |
| | | | | 438/34 |
| 2015/0165464 A1* | 6/2015 | Baek | | C23C 14/042 |
| | | | | 118/504 |
| 2017/0204506 A1* | 7/2017 | Zhang | | C23C 14/042 |
| 2018/0198067 A1* | 7/2018 | Kim | | H01L 51/0011 |
| 2019/0131589 A1* | 5/2019 | Matsueda | | H01L 27/3218 |
| 2019/0144987 A1* | 5/2019 | Guo | | H01L 51/56 |
| | | | | 118/504 |
| 2019/0316245 A1* | 10/2019 | Nakamura | | C23C 14/042 |
| 2020/0149149 A1* | 5/2020 | Lv | | C23C 14/24 |
| 2020/0199733 A1* | 6/2020 | Uchida | | H01L 51/56 |
| 2021/0020874 A1* | 1/2021 | Hong | | H01L 27/3223 |
| 2021/0102268 A1* | 4/2021 | Oka | | C23F 1/02 |
| 2021/0108303 A1* | 4/2021 | Ahn | | H01L 51/56 |
| 2021/0108304 A1* | 4/2021 | Kim | | C23C 14/042 |
| 2021/0108312 A1* | 4/2021 | Oka | | C23F 1/28 |
| 2021/0175295 A1* | 6/2021 | Lee | | H01L 51/0011 |
| 2021/0175299 A1* | 6/2021 | Lee | | H01L 27/3218 |
| 2021/0225953 A1* | 7/2021 | Luo | | C23C 14/042 |
| 2021/0265599 A1* | 8/2021 | Moon | | H01L 51/56 |
| 2021/0336147 A1* | 10/2021 | Ye | | H01L 51/56 |
| 2021/0359209 A1* | 11/2021 | Han | | B05B 12/32 |
| 2021/0371968 A1* | 12/2021 | Higuchi | | H01L 51/0023 |
| 2021/0388479 A1* | 12/2021 | Kim | | C23C 14/042 |
| 2021/0404049 A1* | 12/2021 | Xu | | B05C 17/06 |
| 2022/0002859 A1* | 1/2022 | Luo | | C23C 14/042 |
| 2022/0005885 A1* | 1/2022 | Xiao | | H01L 27/3216 |
| 2022/0010421 A1* | 1/2022 | Moon | | C23C 14/042 |
| 2022/0102638 A1* | 3/2022 | Jang | | H01L 27/3244 |

* cited by examiner

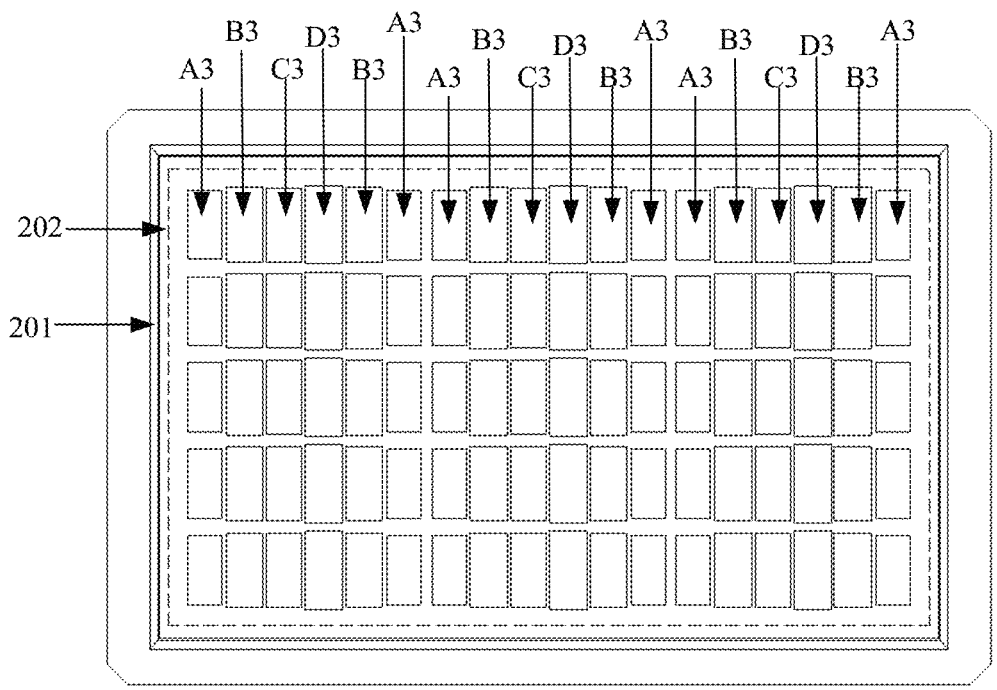

FIG. 6

| Manufacturing at least n evaporation masks, wherein the at least n evaporation masks have a same width and the at least n evaporation masks respectively correspond to n types of display panels with different sizes, the width matching the n types of display panels with different sizes and n being an integer greater than 2 | 701 |

| Obtaining a mask assembly based on the at least n evaporation masks | 702 |

FIG. 7

MASK ASSEMBLY, METHOD FOR MANUFACTURING THE SAME, AND DISPLAY DEVICE

This application is based on and claims priority to Chinese Patent Application No. 202010582174.9, filed on Jun. 23, 2020, the disclosure of which is herein incorporated by reference in its entirety.

TECHNICAL FIELD

The present disclosure relates to a mask assembly, a method for manufacturing the same, and a display device.

BACKGROUND

A light-emitting layer in an organic light-emitting diode (OLED) display panel may be manufactured by using a mask assembly through an evaporation process. The mask assembly is also referred to as a mask frame assembly (MFA). The MFA includes a mask frame and a fine metal mask (FMM) welded on the mask frame, and a mask pattern is provided in the FMM. In the evaporation process, the light-emitting layer may be formed by the mask pattern.

SUMMARY

The present disclosure provides a mask assembly, a method for manufacturing the same, and a display device.

According to a first aspect of the present disclosure, a mask assembly is provided. The mask assembly includes at least n evaporation masks, n being an integer greater than 2, wherein the at least n evaporation masks have a same width and the at least n evaporation masks respectively correspond to n types of display panels with different sizes, the width matching the n types of display panels with different sizes.

In some embodiments, the width is greater than a width of any one of the n types of display panels with different sizes.

In some embodiments, the at least n evaporation masks are subjected to a same tensile force.

In some embodiments, the evaporation mask includes a mask region, widths of the mask regions of the at least n evaporation masks being configured to cause the at least n evaporation masks to be subjected to the same tensile force.

In some embodiments, the mask region is provide with a plurality of evaporation holes, wherein a density of the evaporation holes in the mask region of the evaporation mask is equal to a density of sub-pixels of a display panel corresponding to the evaporation mask, each of the evaporation holes of the evaporation mask is configured to manufacture a sub-pixel of the display panel corresponding to the evaporation mask, and a size of the evaporation hole is equal to a size of a corresponding sub-pixel among the sub-pixels.

In some embodiments, n=4.

In some embodiments, the tensile force of each of the at least n evaporation masks is 5.8 N, and the widths of the mask regions of the evaporation masks corresponding to the n types of display panels with different sizes are 73.77 mm, 72.50 mm, 72.90 mm and 72.35 mm, respectively.

In some embodiments, the width ranges from 73.77 mm to 74.27 mm.

In some embodiments, the evaporation mask is a fine metal mask.

In some embodiments, the mask assembly further includes a foothold mask, wherein the at least n evaporation masks are disposed on a same layer, the at least n evaporation masks and the foothold mask are laminated; the foothold mask includes a plurality of opening areas respectively corresponding to mask regions of the at least n evaporation masks; and a shape and a size of the opening area match those of a corresponding mask region among the mask regions.

In some embodiments, the mask assembly further includes a mask frame, and the foothold mask and the at least n evaporation masks are disposed on the mask frame.

In some embodiments, the evaporation mask includes a mask region provided with a plurality of evaporation holes, wherein a density of the evaporation holes in the mask region of the evaporation mask is equal to a density of sub-pixels of a display panel corresponding to the evaporation mask, each of the evaporation holes of the evaporation mask is configured to manufacture a sub-pixel of the display panel corresponding to the evaporation mask, a size of the evaporation hole is equal to a size of a corresponding sub-pixel among the sub-pixels, and widths of the mask regions of the at least n evaporation masks are configured to cause the at least n evaporation masks to be subjected to a same tensile force; and the mask assembly further includes a foothold mask and a mask frame that are arranged on the mask frame; the at least n evaporation masks are disposed on a same layer, and the at least n evaporation masks and the foothold mask are laminated; wherein the foothold mask includes a plurality of opening areas respectively corresponding to mask regions of the at least n evaporation masks, a shape and a size of the opening area matching those of a corresponding mask region among the mask regions.

According to a second aspect of the present disclosure, a method for manufacturing a mask assembly is provided. The method includes:

manufacturing at least n evaporation masks, wherein the at least n evaporation masks have a same width and the at least n evaporation masks respectively correspond to n types of display panels with different sizes, the width matching the n types of display panels with different sizes and n being an integer greater than 2; and obtaining the mask assembly based on the at least n evaporation masks.

In some embodiments, manufacturing at least n evaporation masks includes:

acquiring n initial widths by determining an initial width corresponding to each display panel with the n types of display panels with different sizes based on a width of the display panel; and determining a maximum value of the n initial widths as the width of the at least n evaporation masks.

In some embodiments, the at least n evaporation masks are subjected to a same tensile force.

In some embodiments, the evaporation mask includes a mask region, widths of the mask regions of the at least n evaporation masks are configured to cause the at least n evaporation masks to be subjected to the same tensile force.

In some embodiments, the mask region is provided with a plurality of evaporation holes, wherein a density of the evaporation holes in the mask region of the evaporation mask is equal to a density of sub-pixels of a display panel corresponding to the evaporation mask, each of the evaporation holes of the evaporation mask is configured to manufacture a sub-pixel of the display panel corresponding to the evaporation mask, and a size of the evaporation hole is equal to a size of a corresponding sub-pixel among the sub-pixels.

In some embodiments, the method further includes: manufacturing a foothold mask including a plurality of opening areas; and obtaining the mask assembly based on the at least n evaporation masks includes: obtaining the mask assembly by laminating the at least n evaporation masks and the foothold mask, wherein in the mask assembly, the at least n evaporation masks are disposed on a same layer, the opening areas of the foothold mask respectively correspond to mask regions of the at least n evaporation masks, and a shape and a size of the opening area match those of a corresponding mask region among the mask regions.

In some embodiments, the method further includes: manufacturing a mask frame, and laminating the at least n evaporation masks and the foothold mask includes: disposing the foothold mask and the at least n evaporation masks on the mask frame, such that the at least n evaporation masks are disposed on the same layer, and the at least n evaporation masks and the foothold mask are laminated.

According to a third aspect of the present disclosure, a display device is provided. At least one film layer in the display device is manufactured by using the mask assembly according to the first aspect or any one of optional embodiments of the first aspect.

BRIEF DESCRIPTION OF THE DRAWINGS

The following briefly introduces the accompanying drawings related to the embodiments of the present disclosure. Apparently, the accompanying drawings in the following description show merely some embodiments of the present disclosure, and persons of ordinary skill in the art may still derive other drawings from these accompanying drawings without creative efforts.

FIG. 6 is a schematic structural diagram of a common mask assembly according to an embodiment of the present disclosure;

FIG. 7 is a flowchart of a method for manufacturing a mask assembly according to an embodiment of the present disclosure;

DETAILED DESCRIPTION

Figure 1:
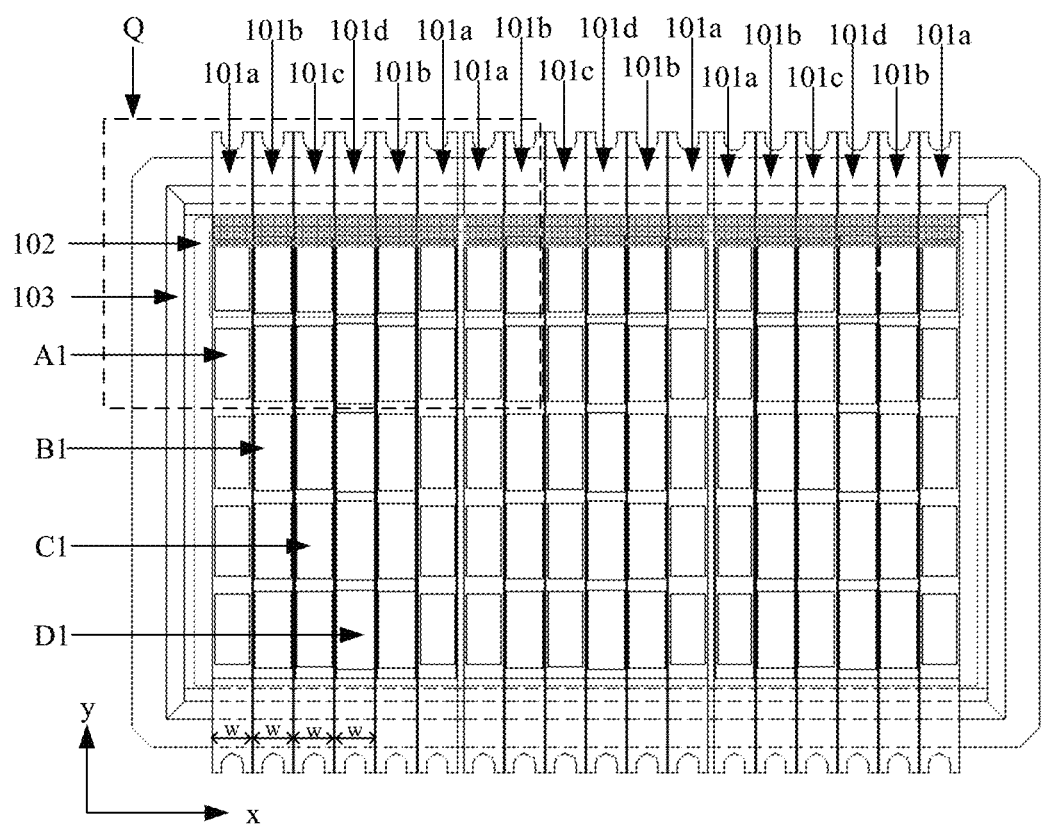
FIG. 1 is a schematic structural diagram of a mask assembly according to an embodiment of the present disclosure.

For clearer descriptions of the principles, technical solutions, and advantages of the present disclosure, the present disclosure is further described hereinafter in conjunction with specific embodiments and with reference to the accompanying drawings.

Unless otherwise defined, the technical terms or scientific terms used in the embodiments of the present disclosure shall be taken to mean the ordinary meanings as understood by the ordinary skill in the art to which the present disclosure belongs. The terms "first," "second," and the like do not denote any order, quantity or importance, but are merely used to distinguish different components. The terms "comprise," "include," and the like are intended to mean that the elements or objects before said term cover the elements or objects or equivalents listed after said term, without excluding other elements or objects. The terms "include," "comprise," and similar terms mean that elements or objects appearing before the term cover the listed elements or objects and its equivalents appearing after the term while other elements or objects are not excluded. The terms "connected," "coupled," and similar terms are not limited to physical or mechanical connections, and may include electrical connection and the connection may be direct or indirect. Terms "upper," "lower," "top," "bottom," and the like are only used to indicate relative positional relations, which may change accordingly when an absolute position of a described object changes. The term "at least one" refers to one or a plurality, and the term "a plurality of" refers to two or more. The character "/" indicates an "or" relation unless otherwise specified in the present disclosure, for example, "A/B" refers to A or B. The term "and/or" in the present disclosure describes an association relation between associated objects and indicates three types of possible relations. For example, A and/or B may be expressed as the following three cases: A exists alone, A and B exist concurrently, and B exists alone.

A light-emitting layer in an OLED display panel may be manufactured by using a mask assembly through an evaporation process. Generally, one mask assembly includes an FMM corresponding to a display panel with a single size, and one mask assembly may be used to manufacture a display panel with the single size. Therefore, different mask assemblies are required to manufacture display panels with different sizes, which leads to higher costs for manufacturing display panels with different sizes.

For example, in a research and development stage of new projects in the display field, the following problems are often encountered: in order to manufacture a new project product, it is necessary to prepare a mask assembly for manufacturing corresponding display panels although a required amount for the new project product is low, which leads to increased research and development costs for the new project product, reduced profits, and less project revenue.

In view of above problems of an existing mask assembly, embodiments of the present disclosure provide a mask assembly. The mask assembly includes at least n evaporation masks, wherein the at least n evaporation masks have a same width, the at least n evaporation masks respectively correspond to n types of display panels with different sizes, and the width matches the n types of display panels with different sizes. Since the mask assembly includes at least n evaporation masks and the at least n evaporation masks correspond to n types of display panels with different sizes, the mask assembly may be used to manufacture the n types of display panels with different sizes. Therefore, the mask assembly has high versatility, which helps to reduce production costs of display panels and increase profits. In addition, since the at least n evaporation masks have the same width, a difference between tensile forces of the at least n evaporation masks is small, which helps to prevent the mask assembly from deformation, warpage, etc. due to a large difference between tensile forces of the at least n evaporation masks. Therefore, evaporation accuracy of the mask assembly, in turn accuracy of display panels manufactured by using the mask assembly, is ensured.

Technical solutions of the present disclosure are introduced below in conjunction with accompanying drawings.

Figure 2:
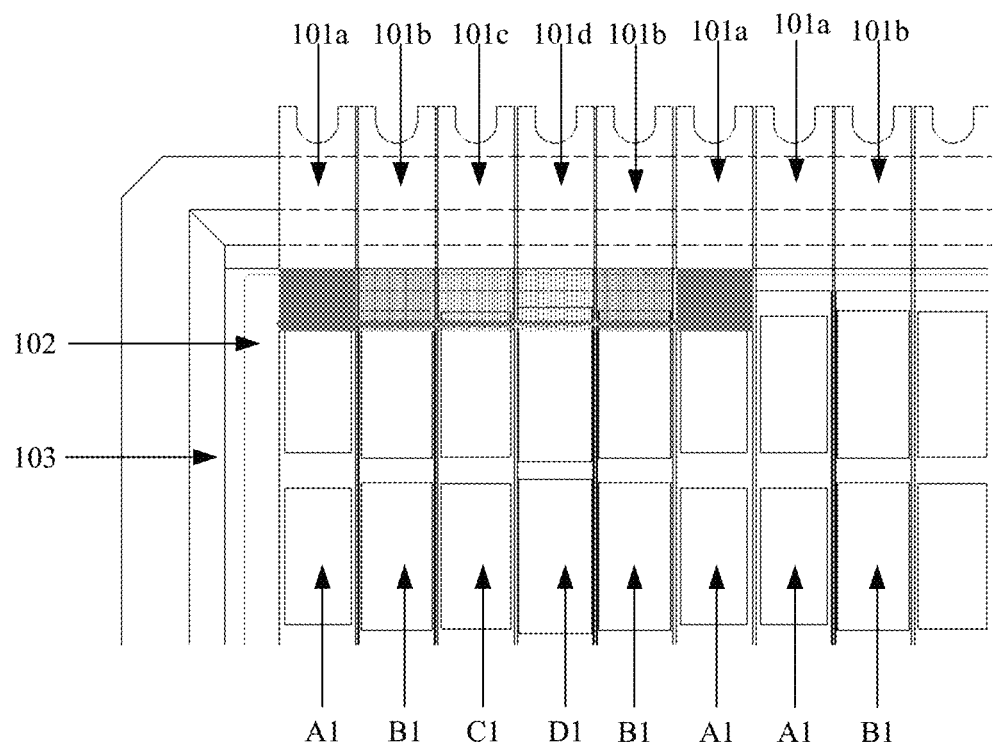
FIG. 2 is an enlarged diagram of a partial region of the mask assembly shown in FIG. 1.

Referring to FIG. 1 and FIG. 2, wherein FIG. 1 is a schematic structural diagram of a mask assembly 10 according to an embodiment of the present disclosure, and FIG. 2 is an enlarged diagram of a partial region Q shown in FIG. 1. As shown in FIG. 1 and FIG. 2, the mask assembly 10 includes at least n evaporation masks 101 (an evaporation mask 101a, an evaporation mask 101b, an evaporation mask 101c and an evaporation mask 101d in FIG. 1 and FIG. 2 are collectively referred to as the evaporation masks 101), and the at least n evaporation masks 101 have a same width w. The at least n evaporation masks 101 correspond to n types of display panels with different sizes, and the width w matches the n types of display panels with different sizes. Each of the evaporation masks 101 is used to manufacture a display panel with a corresponding size.

As shown in FIG. 1, in the at least n evaporation masks 101, the width w of each evaporation mask 101 is a size of the evaporation mask 101 in a first direction x. The at least n evaporation masks 101 may have a same length, and the length of each evaporation mask 101 is a size of the evaporation mask 101 in a second direction y. The embodiment of the present disclosure is described by taking a fact that the at least n evaporation masks 101 have the same length as an example. However, the at least n evaporation masks 101 may have different lengths, which is not limited in embodiments of the present disclosure.

In the mask assembly 10, the at least n evaporation masks 101 may be regularly arranged; alternatively, the at least n evaporation masks 101 may be randomly arranged. The embodiment of the present disclosure does not limit an arrangement mode of the at least n evaporation masks 101. For example, when n=4, the mask assembly 10 includes at least four evaporation masks 101, and the at least four evaporation masks 101 correspond to four types of display panels with different sizes. As shown in FIG. 1, the mask assembly 10 includes 18 evaporation masks. The 18 evaporation masks include 6 evaporation masks 101a, 6 evaporation masks 101b, 3 evaporation masks 101c, and 3 evaporation masks 101d. The 18 evaporation masks are arranged in three groups. Each group includes 2 evaporation masks 101a, 2 evaporation masks 101b, 1 evaporation mask 101c and 1 evaporation mask 101d. The evaporation masks in each group are arranged in the following sequence: 1 evaporation mask 101a, 1 evaporation mask 101b, 1 evaporation mask 101c, 1 evaporation mask 101d, 1 evaporation mask 101b and 1 evaporation mask 101a.

The evaporation mask 101a, the evaporation mask 101b, the evaporation mask 101c, and the evaporation mask 101d respectively correspond to a display panel with one size. That is, each of the evaporation mask 101a, the evaporation mask 101b, the evaporation mask 101c and the evaporation mask 101d is used to manufacture a display panel with one size. For example, the evaporation mask 101a corresponds to a display panel a, the evaporation mask 101b corresponds to a display panel b, the evaporation mask 101c corresponds to a display panel c, and the evaporation mask 101d corresponds to a display panel d. Sizes of the display panel a, the display panel b, the display panel c, and the display panel d are different from each other. The evaporation mask 101a is used to manufacture the display panel a, the evaporation mask 101b is used to manufacture the display panel b, the evaporation mask 101c is used to manufacture the display panel c, and the evaporation mask 101d is used to manufacture the display panel d.

In summary, according to the mask assembly provided by the embodiment of the present disclosure, since the mask assembly includes at least n evaporation masks and the at least n evaporation masks correspond to n types of display panels with different sizes, the mask assembly can be used to manufacture the n types of display panels with different sizes. Therefore, the mask assembly has high versatility, which helps to reduce production costs of display panels and increase profits. In addition, since the at least n evaporation masks have a same width, a difference between tensile forces of the at least n evaporation masks is small and a force distribution of each of the at least n evaporation masks in stretching is more uniform, which helps to prevent the mask assembly from deformation, warpage, etc. in stretching, thereby improving quality of display panels manufactured by using the mask assembly.

Optionally, the n types of display panels with different sizes corresponding to the at least n evaporation masks 101 are all rectangular panels, and the width w of the at least n evaporation masks 101 is greater than a width of any one of the n types of display panels with different sizes. For example, the width w is greater than a width of the largest display panel among the n types of display panels with different sizes. As an example, the width w is a maximum value of n initial widths determined based on widths of the n types of display panels with different sizes respectively. For example, initial widths corresponding to respective display panels with different sizes are determined according to a formula w0=wp+a, wherein w0 represents the initial width, wp represents a minimum width of the display panel (or a minimum side length of the display panel), and a is a constant in a range of 2 mm≥a≥1.5 mm. In the embodiment of the present disclosure, a maximum value of the n initial widths corresponding to the n types of display panels with different sizes is determined as the width w of the at least n evaporation masks corresponding to the n types of display panels with different sizes. In this way, an initial width corresponding to a display panel with a large size may be compatible with an initial width corresponding to a display panel with a small size, thus it is ensured that the width w of the at least n evaporation masks 101 may match the n types of display panels with different sizes.

Optionally, the width w may range from 73.77 mm to 74.27 mm. A specific value of the width w may be set according to actual conditions, which is not limited in the embodiment of the present disclosure.

Optionally, the evaporation mask 101 may be an FMM.

A fact that n=4 and the evaporation mask 101 is the FMM is taken as an example. Table 1 shows sizes of the n types of display panels with different sizes, the n initial widths corresponding to the n types of display panel with different sizes, and widths of at least n FMMs corresponding to the n types of display panels with different sizes as follows.

TABLE 1

| | Sizes of display panels (mm) | Initial widths (mm) | Widths of FMMs (mm) |
| --- | --- | --- | --- |
| Display panel a | 66.08*131.72 | 67.58~68.08 | 73.77~74.27 |
| Display panel b | 71.12*142.08 | 72.62~73.12 | 73.77~74.27 |
| Display panel c | 68.53*140.45 | 70.03~70.53 | 73.77~74.27 |
| Display panel d | 72.27*148.35 | 73.77~74.27 | 73.77~74.27 |

As shown in Table 1, each of display panels with different sizes corresponds to an initial width range, and an initial width corresponding to each of the display panels with different sizes may be a maximum value in a corresponding initial width range. For example, for the n (n=4) types of display panels with different sizes shown in Table 1, an initial width corresponding to the display panel a is 68.08 mm, an initial width corresponding to the display panel b is 73.12 mm, an initial width corresponding to the display panel c is 70.53 mm, and an initial width corresponding to the display panel d is 74.27 mm. A maximum value of the n initial widths corresponding to the n (n=4) types of display panels with different sizes is 74.27 mm. Therefore, it is determined that the width of the at least n evaporation masks (that is, FMM) is 74.27 mm.

Alternatively, as shown in Table 1, the width of the at least n evaporation masks (i.e., FMM) corresponding to n (n=4) types of display panels with different sizes ranges from 73.77 mm and 74.27 mm. The range (i.e., 73.77 mm-74.27 mm) of the width of the at least n evaporation masks (i.e., FMM) is a maximum range among n initial width ranges corresponding to the n types of display panels with different sizes. The width of the at least n evaporation masks (i.e., FMM) may be determined from the range of the width of the at least n evaporation masks (i.e., FMM). For example, a maximum value in the range of the width of the at least n evaporation masks (i.e., FMM) may be determined as the width of the at least n evaporation masks (i.e., FMM), that is, as shown in Table 1, 74.27 mm is determined as the width of the at least n evaporation masks (i.e., FMM).

Generally, when designing an FMM corresponding to each of display panels with different sizes, an initial width corresponding to the display panel is determined as a width of the FMM corresponding to the display panel. In this way, widths of FMMs corresponding to display panels with different sizes are different. If the FMMs with different widths are designed in the same mask assembly, tensile forces of the FMMs with different widths are different, which may easily cause problems such as deformation and warpage of the mask assembly, thereby affecting evaporation accuracy of the mask assembly. In the mask assembly according to the embodiment of the present disclosure, widths of FMMs corresponding to display panels with different sizes are the same, which helps to reduce a difference between tensile forces of different FMMs. Therefore, problems such as deformation and warpage of the mask assembly are avoided, and the evaporation accuracy of the mask assembly is ensured. In this way, quality of display panels manufactured by using the mask assembly is ensured.

As an example, the evaporation mask 101a, the evaporation mask 101b, the evaporation mask 101c and the evaporation mask 101d shown in FIG. 1 correspond to the display panel a, the display panel b, the display panel c and the display panel d shown in Table 1 respectively, and the evaporation mask 101a, the evaporation mask 101b, the evaporation mask 101c and the evaporation mask 101d have the same width w. In this way, a difference between tensile forces of the evaporation mask 101a, the evaporation mask 101b, the evaporation mask 101c and the evaporation mask 101d is small. When stretching the evaporation mask 101a, the evaporation mask 101b, the evaporation mask 101c and the evaporation mask 101d, a force distribution of the mask assembly 10 may be more uniform, then problems such as deformation and warpage of the mask assembly are avoided, and the evaporation accuracy of the mask assembly 10 is ensured. Therefore, quality of the display panel a, the display panel b, the display panel c and the display panel d manufactured by using the mask assembly 10 is assured. In addition, by using the mask assembly shown in FIG. 1, the display panel a, the display panel b, the display panel c and the display panel d may be manufactured simultaneously, which helps to improve production efficiency, save evaporation materials (if evaporation masks corresponding to display panels with different sizes are designed in different mask assemblies, it is required to change the mask assemblies when manufacturing display panels with different sizes, and a process of changing the mask assemblies may easily cause waste of evaporation materials).

Optionally, the at least n evaporation masks 101 may be subjected to the same tensile force, since on the one hand, the at least n evaporation masks 101 have the same width w, and on the other hand, each of the at least n evaporation masks 101 includes a mask region, and widths of the mask regions of the at least n evaporation masks 101 are configured to cause the at least n evaporation masks 101 to be subjected to the same tensile force.

As an example, as shown in FIG. 1 and FIG. 2, the evaporation mask 101a includes a mask region A1, the evaporation mask 101b includes a mask region B1, the evaporation mask 101c includes a mask region C1, and the evaporation mask 101d includes a mask region D1. A width of the mask region A1, a width of the mask region B1, a width of the mask region C1, and a width of the mask region D1 are configured to cause the evaporation mask 101a, the evaporation mask 101b, the evaporation mask 101c and the evaporation mask 101d to be subjected to the same tensile force. A width direction of the mask region of each evaporation mask is parallel to a width direction of the evaporation mask. In the mask assembly shown in FIG. 1, a width of each of the mask region A1, the mask region B1, the mask region C1 and the mask region D1 is a size of the mask region in a first direction x. For brevity, only a part of mask regions is marked in FIG. 1. In the embodiment of the present disclosure, each evaporation mask 101 includes a plurality of mask regions. For example, as shown in FIG. 1, each of the evaporation mask 101a, the evaporation mask 101b, the evaporation mask 101c and the evaporation mask 101d includes 5 mask regions.

In a design stage of the mask assembly 10 according to the embodiment of the present disclosure, a tensile force of an evaporation mask (for example, the evaporation mask 101a) corresponding to a display panel with a certain size may be determined as a reference force. By adjusting a width of a mask region of an evaporation mask (e.g., the evaporation mask 101b) corresponding to a display panel with other size, a tensile force of the evaporation mask 101b may be adjusted, such that the tensile force of the evaporation mask 101b is equal to the reference force. A final width of the mask region B1 of the evaporation mask 101b is determined as a width of the mask region B1 when a tensile force of the evaporation mask 101b is equal to the reference force. Thereby, the width of the mask region B1 of the evaporation mask 101b and the width of the mask region A1 of the evaporation mask 101a may be configured to cause the evaporation mask 101b and the evaporation mask 101a to be subjected to the same tensile force. Performing such an adjustment process on the evaporation mask 101b, the evaporation mask 101c and the evaporation mask 101d, respectively, may make the evaporation mask 101a, the evaporation mask 101b, the evaporation mask 101c and the evaporation mask 101d (four types of evaporation masks) to be subjected to the same tensile force.

As an example, referring to Table 1, in a case that a width of the FMM is 74.27 mm, according to a conventional design, widths of mask regions of FMMs corresponding to the above four types of display panels with different sizes are all 73.77 mm (in the conventional design, a width of a FMM is a corresponding initial width, and a size of a corresponding display panel is equal to a size of a mask region of the FMM). However, since display panels with different sizes have different sizes and distribution modes of sub-pixels, evaporation holes in mask regions of FMMs corresponding to display panels with different sizes have different sizes and distribution modes, which may easily cause a large difference between tensile forces of FMMs corresponding to display panels with different sizes, and lead to deformation, warpage, and the like, of a mask assembly. Therefore, in the design stage of the mask assembly 10 of the embodiment of the present disclosure, widths of mask regions of FMMs corresponding to display panels with different sizes may be adjusted such that the FMMs corresponding to the display panels with different sizes are subjected to the same tensile force. As an example, for the display panel a in Table 1, the width of mask regions of the FMM corresponding to the display panel a may be 73.77 mm, and the tensile force of the FMM corresponding to the display panel a may be used as a reference force to adjust widths of mask regions of FMMs corresponding to each of the display panel b, the display panel c and the panel display d, such that the tensile force of the FMM corresponding to each of the display panel b, the display panel c and the display panel d is equal to the reference force. A final width of a mask region of a corresponding FMM is determined as a width of the mask region of each FMM when a tensile force is equal to the reference force. Finally determined tensile forces of FMMs and widths of mask regions of the FMMs corresponding to the display panel a, the display panel b, the display panel c, and the display panel d respectively may be seen in Table 2.

TABLE 2

|  | Tensile forces of FMMs (N) | Widths of mask regions of FMMs (mm) |
| --- | --- | --- |
| Display panel a | 5.8 | 73.77 |
| Display panel b | 5.8 | 72.50 |
| Display panel c | 5.8 | 72.90 |
| Display panel d | 5.8 | 72.35 |

Generally, a shape of a mask region of the FMM is the same as a shape of a display region of a corresponding display panel, and a size of the mask region of the FMM match a size of the display region of the corresponding display panel (e.g., a width of a mask region of the FMM is equal to a width of a display region of the corresponding display panel; or, the width of the mask region of the FMM is greater than the width of the display region of the corresponding display panel and a difference between the two widths is less than a preset difference). Moreover, the tensile force of the FMM is related to the width of the mask region of the FMM. In the embodiments of the present disclosure, widths of mask regions of FMMs are adjusted such that the FMMs corresponding to display panels with different sizes have the same tensile force. As a result, the mask assembly may be subjected to a more uniform force, which avoid an uneven force (leading to deformation, warpage and other problems) of the mask assembly due to various tensile forces of different FMMs. For adjusting widths of mask regions of FMMs corresponding to display panels with different sizes such that the FMMs corresponding to the display panels with different sizes may be subjected to the same tensile force, in terms of a mechanical effect, FMMs corresponding to the display panels with different sizes are equivalent to the same FMM corresponding to display panels with the same size. Therefore, the above processing mode solves a problem of an uneven force distribution on a mask assembly caused by designing FMMs corresponding to display panels with different sizes in the same mask assembly.

In an embodiment of the present disclosure, a plurality of evaporation holes are provided in a mask region of the evaporation mask. A density of the evaporation holes in the mask region of the evaporation mask is equal to a density of sub-pixels of a display panel corresponding to the evaporation mask, each of the evaporation holes of the evaporation mask is configured to manufacture a sub-pixel of the display panel corresponding to the evaporation mask, and a size of the evaporation hole is equal to a size of a corresponding sub-pixel among the sub-pixels. Based on such design of the mask region, by adjusting widths of mask regions of evaporation masks corresponding to display panels with different sizes, the evaporation masks corresponding to the display panels with different sizes may be subjected to the same tensile force.

Figure 3:
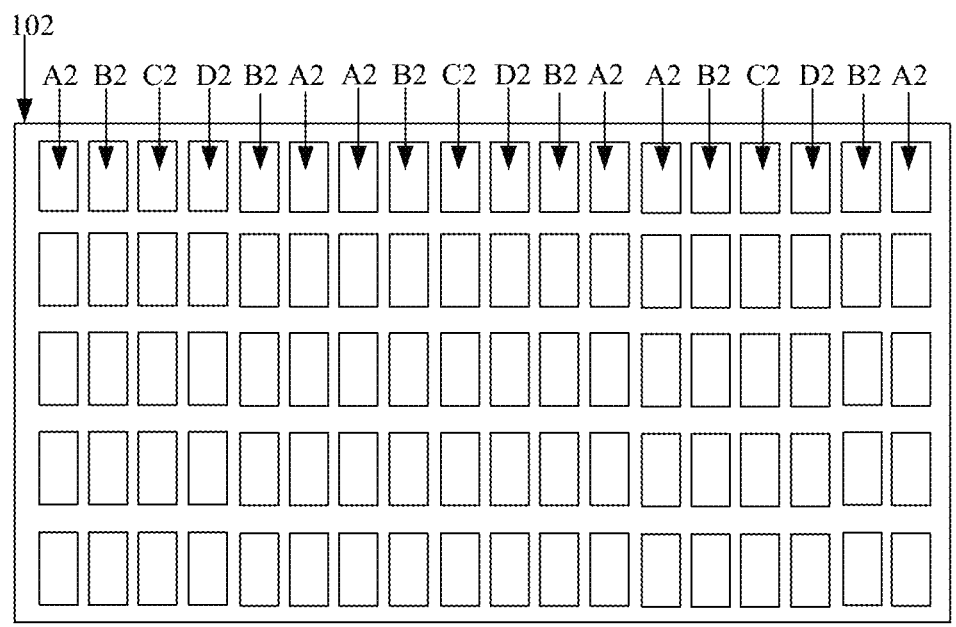
FIG. 3 is a schematic structural diagram of a foothold mask according to an embodiment of the present disclosure.

In an optional embodiment of the present disclosure, referring to FIG. 1 and FIG. 2, the mask assembly 10 further includes a foothold mask (F-mask) 102. Referring to FIG. 3, which is a schematic structural diagram of the foothold mask 102 according to an embodiment of the present disclosure. The foothold mask 102 has a plurality of opening areas (including a plurality of opening areas A2, a plurality of opening areas B2, a plurality of opening areas C2 and a plurality of opening areas D2). The opening areas of the foothold mask 102 correspond to mask regions of the at least n evaporation masks 101 respectively, and a shape and a size of the opening area of the foothold mask 102 match those of a corresponding mask region among the mask regions. For example, the shape of each opening area is the same as the shape of the corresponding mask region; or the size (for example, a side length) of each opening area is greater than the size (for example, a side length) of the corresponding mask region, and a difference between the size of each opening area and the size of the corresponding mask region is smaller than a preset difference.

As shown in FIG. 3, opening areas in the first column, the $6^{th}$ column, the $7^{th}$ column, the $12^{th}$ column, the $13^{th}$ column and the $18^{th}$ column are opening areas A2. The opening areas A2 in the first column, the $6^{th}$ column, the $7^{th}$ column, the $12^{th}$ column, the $13^{th}$ column and the $18^{th}$ column correspond to mask regions A1 in 6 evaporation masks 101a in FIG. 1 respectively. A shape and a size of each of the opening areas A2 match those of a corresponding mask region A1. Opening areas in the second column, the $5^{th}$ column, the $8^{th}$ column, the $11^{th}$ column, the $14^{th}$ column and the $17^{th}$ column are opening areas B2. The opening areas B2 in the second column, the $5^{th}$ column, the $8^{th}$ column, the $11^{th}$ column, the $14^{th}$ column and the $17^{th}$ column correspond to mask regions B1 in 6 evaporation masks 101b in FIG. 1 respectively. A shape and a size of each of the opening areas B2 match those of a corresponding mask region B1. Opening areas in the third column, the $9^{th}$ column and the $15^{th}$ column are opening areas C2. The opening areas C2 in the third column, the $9^{th}$ column and the $15^{th}$ column correspond to mask regions C1 in 3 evaporation masks 101c in FIG. 1 respectively. A shape and a size of each of the opening areas C2 match those of a corresponding mask region C1. Opening areas in the fourth column, the 10th column and the 16th column are opening areas D2. The opening areas D2 in the fourth column, the $10^{th}$ column and the $16^{th}$ column correspond to mask regions D1 in 3 evaporation masks 101d in FIG. 1 respectively. A shape and a size of each of the opening areas D2 match those of a corresponding mask region D1.

Figure 4:
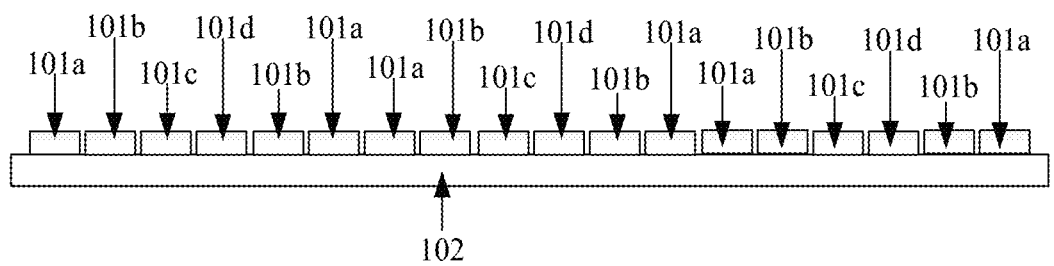
FIG. 4 is a positional relationship diagram of a foothold mask and an evaporation mask according to an embodiment of the present disclosure.

Referring to FIG. 4, which is a positional relationship diagram of at least n evaporation masks 101 and the foothold mask 102 in the mask assembly 10. As shown in FIG. 4, the at least n evaporation masks 101 (the evaporation mask 101a, the evaporation mask 101b, the evaporation mask 101c and the evaporation mask 101d in FIG. 4 are collectively referred to as the evaporation masks 101) are disposed on a same layer. The at least n evaporation masks 101 and the foothold mask 102 are laminated. On a reference plane, an orthographic projection of each opening area (not shown in FIG. 4) of the foothold mask 102 covers an orthographic projection of a corresponding mask region (not shown in FIG. 4), wherein the reference plane is parallel to a layer where the at least n evaporation masks 101 are disposed.

Figure 5:
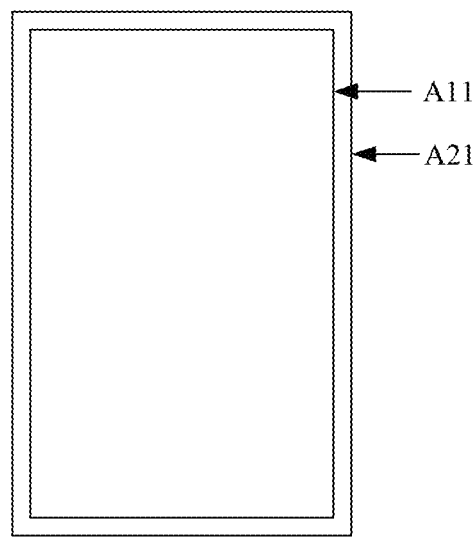
FIG. 5 is a projection relationship diagram of an opening area of a foothold mask and a mask region of an evaporation mask according to an embodiment of the present disclosure.

As an example, FIG. 5 is referred to, which is a projection relationship diagram of an opening area (e.g., the opening area A2) of the foothold mask 102 and a mask region (e.g., the mask region A1) of the evaporation mask 101 according to an embodiment of the present disclosure. On the reference plane (not shown in FIG. 5), the orthographic projection A21 of the opening area A2 covers the orthographic projection A11 of the corresponding mask region A1. In other words, an area of the orthographic projection A11 of the mask region A1 onto the reference plane is smaller than an area of the orthographic projection A21 of the corresponding opening area A2 onto the reference plane, and the orthographic projection A11 of the mask region A1 onto the reference plane falls within the orthographic projection A21 of the corresponding opening area A2 onto the reference plane.

In an optional embodiment of the present disclosure, referring to FIG. 1 and FIG. 2 again, the mask assembly 10 further includes a mask frame 103. The foothold mask 102 and the at least n evaporation masks 101 are disposed on the mask frame 103. For example, the foothold mask 102 and/or the evaporation mask 101 are welded to the mask frame 103. Alternatively, the foothold mask 102 and/or the evaporation mask 101 are fixed on the mask frame 103 by screws.

The mask assembly 10 according to the embodiment of the present disclosure may be used for manufacturing n types of display panels with different sizes, and the n types of display panels with different sizes may include OLED panels. The evaporation mask 101 in the mask assembly 10 is used to define sub-pixels of the OLED panel; the foothold mask 102 is used to hold the evaporation mask 101 and shield an unmasked region of the evaporation mask 101; and the evaporation mask 101 is mainly used to manufacture a light-emitting layer in the OLED panel. In a process of manufacturing OLED panels, common mask assemblies for manufacturing structures such as cathodes in OLED panels are further required.

Referring to FIG. 6, which is a schematic structural diagram of a common mask assembly 20 according to an embodiment of the present disclosure. The common mask assembly 20 includes a mask frame 201 and a common mask 202 disposed on the mask frame 201. The common mask 202 is welded on the mask frame 201; alternatively, the common mask 202 is fixed on the mask frame 201 by screws. The mask frame 201 is used to fix and support the common mask 202. As shown in FIG. 6, the common mask 202 is provided with a plurality of opening areas (including a plurality of opening areas A3, a plurality of opening areas B3, a plurality of opening areas C3 and a plurality of opening areas D3). A number of the plurality of openings areas may be equal to a number of the plurality of openings areas of the foothold mask 102, and the plurality of opening areas are arranged at the same positions as the plurality of openings areas of the foothold mask 102. For example, as shown in FIG. 6, the opening areas in the common mask 202 correspond to the opening areas of the foothold mask 102 respectively, and a shape and a size of the opening areas in the common mask 202 match those of the corresponding opening areas in the foothold mask 102.

As shown in FIG. 6, opening areas in the first column, the $6^{th}$ column, the $7^{th}$ column, the $12^{th}$ column, the $13^{th}$ column and the $18^{th}$ column of the common mask 202 are opening areas A3. The opening areas A3 in the first column, the $6^{th}$ column, the $7^{th}$ column, the $12^{th}$ column, the $13^{th}$ column and the $18^{th}$ column of the common mask 202 correspond to opening areas A2 in the first column, the $6^{th}$ column, the $7^{th}$ column, the $12^{th}$ column, the $13^{th}$ column and the $18^{th}$ column of the foothold mask 102 respectively. A shape and a size of each of the opening areas A3 match those of a corresponding opening area A2. Opening areas in the second column, the $5^{th}$ column, the $8^{th}$ column, the $11^{th}$ column, the $14^{th}$ column and the $17^{th}$ column of the common mask 202 are opening areas B3. The opening areas B3 in the second column, the $5^{th}$ column, the $8^{th}$ Column, the $11^{th}$ column, the $14^{th}$ column and the $17^{th}$ column of the common mask 202 correspond to opening areas B2 in the second column, the $5^{th}$ column, the $8^{th}$ Column, the $11^{th}$ Column, the $14^{th}$ column and the $17^{th}$ column of the foothold mask 102 respectively. A shape and a size of each of the opening areas B3 match those of a corresponding opening area B2. Opening areas in the third column, the $9^{th}$ column and the $15^{th}$ column of the common mask 202 are opening areas C3. The opening areas C3 in the third column, the $9^{th}$ column and the $15^{th}$ column of the common mask 202 correspond to opening areas C2 in the third column, the $9^{th}$ column and the $15^{th}$ column of the foothold mask 102 respectively. A shape and a size of each of the opening areas C3 match those of a corresponding opening area C2. Opening areas in the fourth column, the $10^{th}$ column and the $16^{th}$ column of the common mask 202 are opening areas D3. The opening areas D3 in the fourth column, the $10^{th}$ column and the $16^{th}$ column of the common mask 202 correspond to opening areas D2 in the fourth column, the $10^{th}$ column and the $16^{th}$ column of the foothold mask 102 respectively. A shape and a size of each of the opening areas D3 match those of a corresponding opening area D2.

In the embodiment of the present disclosure, according to a backplane layout drawing of the display panels, opening areas corresponding to display panels with different sizes in the foothold mask may be adjusted, and opening areas corresponding to the display panels with different sizes in the common mask may be adjusted, such that the opening areas in the foothold mask and the opening areas in the common mask both match a display region of a corresponding display panel.

In summary, the mask assembly according to the embodiments of the present disclosure can be compatible with display panels with different pixel arrangements, pixel sizes, and different cell sizes. By adjusting a width of an evaporation mask and/or a width of an evaporation area, it is ensured that a tensile force of a plurality of evaporation masks designed in the same mask assembly and corresponding to display panels with different sizes is balanced, which helps to reduce design costs of mask assemblies. The mask assembly according to the embodiment of the present disclosure can greatly save costs of evaporation masks. A purchase amount of foothold masks is reduced and evaporation materials are saved by sharing a mask assembly for display panels with different sizes. In addition, the mask assembly according to the embodiment of the present disclosure can alleviate project schedule conflicts and tight deadlines of masks, thereby realizing actual product diversification and enhancing a company's competitiveness.

The above-mentioned introduces the mask assembly of the present disclosure, and a method for manufacturing a mask assembly is introduced below. Descriptions in the following embodiments may be referred to for the method and principles for manufacturing the mask assembly in the embodiments of the present disclosure.

Referring to FIG. 7, which is a flowchart of a method for manufacturing a mask assembly according to an embodiment of the present disclosure. The method may include the following steps:

In step 701, at least n evaporation masks are manufactured, wherein the at least n evaporation masks have a same width and the at least n evaporation masks respectively correspond to n types of display panels with different sizes, the width matching the n types of display panels with different sizes and n being an integer greater than 2.

In step 702, the mask assembly is obtained based on the at least n evaporation masks.

In summary, according to the method for manufacturing a mask assembly provided by the embodiment of the present disclosure, the mask assembly obtained based on the at least n evaporation masks includes the at least n evaporation masks. Since the at least n evaporation masks correspond to n types of display panels with different sizes, the mask assembly can be used to manufacture the n types of display panels with different sizes. Therefore, the mask assembly has high versatility, which helps to reduce production costs of display panels and increase profits. In addition, since the at least n evaporation masks have a same width, a difference between tensile forces of the at least n evaporation masks is small and a force distribution of the at least n evaporation masks in stretching is more uniform, which helps to prevent the mask assembly from deformation, warpage, etc. in stretching, thereby improving quality of display panels manufactured by using the mask assembly.

Figure 8:
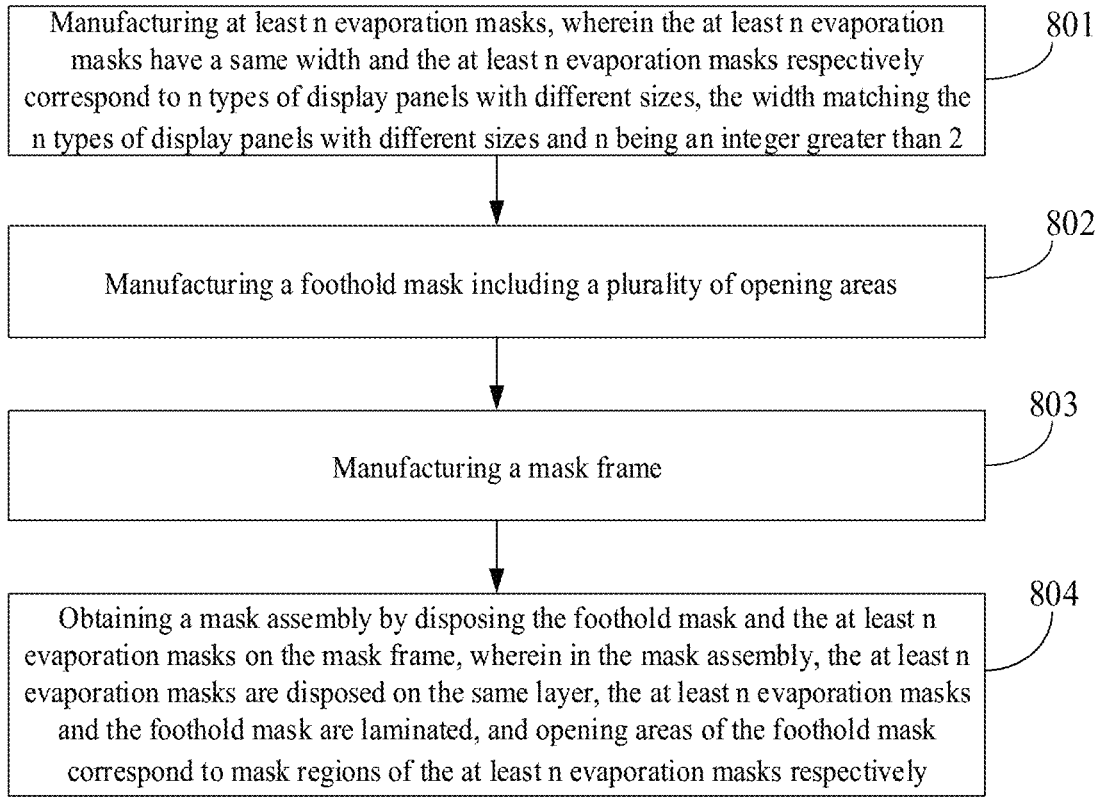
FIG. 8 is a flowchart of a method for manufacturing a mask assembly according to another embodiment of the present disclosure.

Referring to FIG. 8, which is a flowchart of a method for manufacturing a mask assembly according to another embodiment of the present disclosure. The method may be used to manufacture the mask assembly 10 as shown in FIG. 1. The method includes the following steps:

In step 801, at least n evaporation masks are manufactured, wherein the at least n evaporation masks have a same width and the at least n evaporation masks respectively correspond to n types of display panels with different sizes, the width matching the n types of display panels with different sizes and n being an integer greater than 2.

Optionally, n initial widths are acquired by determining an initial width corresponding to each display panel with the n types of display panels with different sizes based on a width of the display panel, and a maximum value in the n initial widths is determined as the width of the at least n evaporation masks. The at least n evaporation masks have the same width.

For a display panel with each of the sizes, an initial width of an evaporation area of a corresponding evaporation mask of the display panel is determined according to a size of a display region of the display panel. A size and a distribution mode of evaporation holes in the evaporation area of the corresponding evaporation mask are determined according to a size and a distribution mode of sub-pixels of the display panel. Taking an evaporation mask corresponding to a display panel with a certain size as a reference mask, an initial width of an evaporation area of the reference mask is determined as a final width of the evaporation area of the reference mask, and a tensile force of the reference mask is determined as a reference force. After that, a width of a mask region of each non-reference mask (referring to evaporation masks except for the reference mask) is adjusted such that a tensile force of each non-reference mask is equal to the reference force; and a width of the mask region of each non-reference mask is determined as a final width of the mask region of the non-reference mask when the tensile force of the non-reference mask is equal to the reference force.

After the above processing, the width of the at least n evaporation masks, widths (i.e., the final width) of evaporation areas corresponding to each of display panels with different sizes, and a size of and a distribution mode of evaporation holes in the evaporation area may be determined. The above process of determining the width of the evaporation mask, widths of the evaporation areas, and the size and distribution mode of the evaporation holes may be performed in the design stage of the evaporation mask. In the design stage, after determining the width of the at least n evaporation masks, the widths of evaporation areas corresponding to respective display panels with different sizes, and the size and distribution mode of evaporation holes in the evaporation areas, the at least n evaporation masks may be manufactured based on the width of the at least n evaporation masks, the widths of evaporation areas corresponding to respective display panels with different sizes, and the size and distribution mode of evaporation holes in the evaporation areas.

As an example, at least n mask bodies may be manufactured first. The at least n mask bodies have a same width. The at least n mask bodies may have a same length, and each of the mask bodies is a rectangular plate without any pattern. Next, each mask body of the at least n mask bodies is processed through a patterning process, and a plurality of mask regions are formed on the mask body, the mask region being provided with a plurality of evaporation holes. After the mask regions are formed on the mask body, an evaporation mask may be obtained. After processing the at least n mask bodies, at least n evaporation masks may be obtained. For structures of the at least n evaporation masks, FIG. 1 and FIG. 2 may be referred to.

As an example, for each of display panels with different sizes, an initial width corresponding to the display panel is determined according to a formula w0=wp+a, wherein w0 represents the initial width, wp represents a minimum width of the display panel, a is a constant in a range of 2 mm≥a≥1.5 mm.

In step 802, a foothold mask including a plurality of opening areas is manufactured.

Optionally, the mask body is manufactured first, then the mask body is processed through a patterning process to form a plurality of opening areas on the mask body, so as to obtain a foothold mask. The mask body is a plate body without any pattern, and a structure of the foothold mask is shown as in FIG. 3.

In step 803, a mask frame is manufactured.

Optionally, the mask frame is manufactured by an injection molding process or a casting process.

In step 804, a mask assembly is obtained by disposing the foothold mask and the at least n evaporation masks on the mask frame. In the mask assembly, the at least n evaporation masks are disposed on the same layer, the at least n evaporation masks and the foothold mask are laminated, and opening areas of the foothold mask correspond to mask regions of the at least n evaporation masks respectively.

Figure 9:
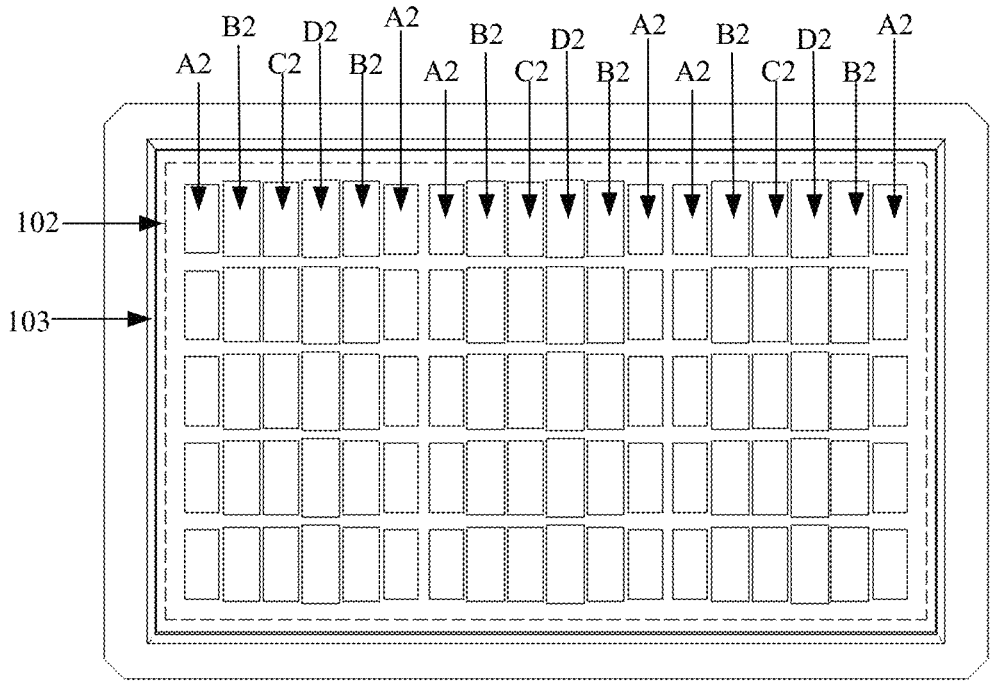
FIG. 9 is a schematic diagram of a foothold mask disposed on a mask frame according to an embodiment of the present disclosure.

Optionally, the foothold mask is first arranged on the mask frame, such that the foothold mask is stretched. For example, FIG. 9 may be referred to for a schematic diagram of the foothold mask 102 disposed on the mask frame 103. Then the at least n evaporation masks are disposed on the mask frame, such that each of the evaporation masks is stretched, wherein the at least n evaporation masks are disposed on the same layer, and the at least n evaporation masks are laminated on the foothold mask. FIG. 1 may be referred to for a schematic diagram of the at least n evaporation masks 101 disposed on the mask frame 103, wherein the foothold mask 102 and/or the evaporation masks 101 may be welded to the mask frame 103, or the foothold mask 102 and/or the evaporation masks 101 may be fixed to the mask frame 103 by screws.

In summary, the mask assembly manufactured by the method according to the embodiments of the present disclosure can be compatible with display panels with different pixel arrangements, pixel sizes, and different cell sizes. By adjusting a width of an evaporation mask and/or a width of an evaporation area, it is ensured that a tensile force of a plurality of evaporation masks designed in the same mask assembly and corresponding to display panels with different sizes is balanced, which helps to reduce design costs of mask assemblies. The mask assembly according to the embodiment of the present disclosure can greatly save costs of evaporation masks. A purchase amount of foothold masks is reduced and evaporation materials are saved by sharing a mask assembly for display panels with different sizes. In addition, the mask assembly according to the embodiment of the present disclosure can alleviate project schedule conflicts and tight deadlines of masks, thereby realizing actual product diversification and enhancing a company's competitiveness.

Figure 10:
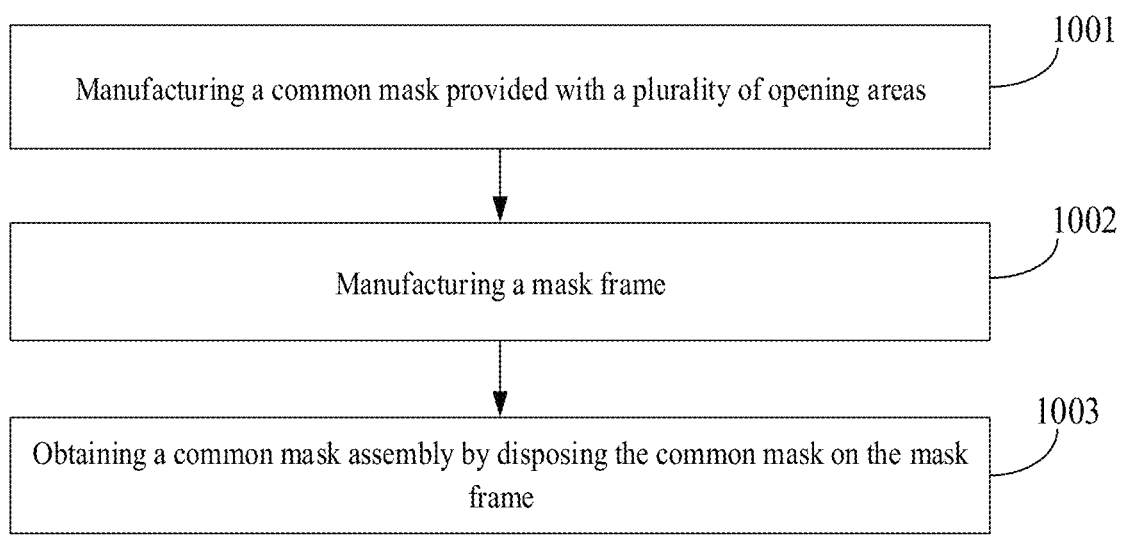
FIG. 10 is a flowchart of a method for manufacturing a common mask assembly according to an embodiment of the present disclosure.

Embodiments of the present disclosure further provides a method for manufacturing a common mask assembly. The method may be used to manufacture the common mask assembly 20 as shown in FIG. 6. As shown in FIG. 10, the method includes the following steps:

In step 1001, a common mask provided with a plurality of opening areas is manufactured.

A mask body may be manufactured first, and then the mask body is processed through a patterning process to form the plurality of opening areas on the mask body, so as to obtain the common mask. The mask body is a plate body without any pattern, and a structure of the common mask is similar to the structure of the foothold mask shown in FIG. 3, and is not be described repeatedly here.

In step 1002, a mask frame is manufactured.

Optionally, the mask frame is manufactured by an injection molding process or a casting process.

In step 1003, the common mask assembly is obtained by disposing the common mask on the mask frame.

A structure of the common mask assembly may be seen in FIG. 6. The common mask 202 is welded to the mask frame 201, or the common mask 202 is fixed on the mask frame 201 by screws.

Embodiments of the present disclosure further provides a display device, and at least one film layer in the display device is manufactured by using the mask assembly 10 according to the foregoing embodiments. The display device may be an electroluminescence display device, for example, an OLED panel.

In optional embodiments of the present disclosure, the display device may be any product having a display function or any component of the product, such as electronic paper, mobile phone, tablet computer, television, monitor, notebook computer, digital photo frame, navigator, wearable device, or virtual reality device, etc.

In foregoing embodiments, an orthographic projection of a device or structure onto a plane refers to an orthographic projection of the device or structure projected onto the plane. For example, an orthographic projection of an opening area of the foothold mask 102 onto a reference plane refers to an orthographic projection of the opening area of the foothold mask 102 projected onto the reference plane.

It should be noted that in the drawings, the dimensions of the layers and regions may be exaggerated for the clarity of the drawings. It can be understood that when an element or layer is named to be disposed "on" another element or layer, the element or layer may be directly disposed on the another element, or there may be an intermediate layer. Further, it can be understood that when an element or layer is named to be disposed "under" another element or layer, the element or layer may be directly disposed under the another element, or there may be at least one intermediate layer or element. Further, it can be understood that when an element or layer is named to be disposed "between" two layers or two elements, the element or layer may be the exclusive one between the two layers or two elements, or there may be at least one intermediate layer or element. Similar reference signs refer to similar elements throughout the whole text.

Described above are merely exemplary embodiments of the present disclosure, and are not intended to limit the present disclosure. For those skilled in the art, the present disclosure may have various modifications and changes. Within the spirit and principles of the disclosure, any modifications, equivalent substitutions, improvements, and the like are within the protection scope of the present disclosure.

What is claimed is:

1. A mask assembly, comprising at least n evaporation masks, n being an integer greater than 2, wherein
the at least n evaporation masks have a same width and the at least n evaporation masks respectively correspond to n types of display panels with different sizes, the width matching the n types of display panels with different sizes;
wherein the at least n evaporation masks are subjected to a same tensile force; and
wherein the at least n evaporation masks comprise mask regions, and widths of the mask regions of the at least n evaporation masks are configured to cause the at least n evaporation masks to be subjected to the same tensile force;
wherein the mask assembly further comprises a foothold mask, the at least n evaporation masks and the foothold mask are laminated, the foothold mask comprises a plurality of opening areas, a shape of each of the plurality of opening areas is as same as a shape of a corresponding mask region, a size of each the plurality of opening areas is greater than a size of a corresponding mask region, a portion between any two adjacent opening areas is configured to support the at least n evaporation masks such that the at least n evaporation masks are disposed on a same layer.

2. The mask assembly according to claim 1, wherein the width is greater than a width of any one of the n types of display panels with different sizes.

3. The mask assembly according to claim 1, wherein each of the mask regions is provided with a plurality of evaporation holes, wherein a density of the plurality of evaporation holes is equal to a density of sub-pixels of a display panel corresponding to the each of the at least n evaporation masks, each of the plurality of evaporation holes is configured to manufacture a sub-pixel of the display panel corresponding to the each of the at least n evaporation masks, and a size of the plurality of evaporation holes is equal to a size of a corresponding sub-pixel among the sub-pixels.

4. The mask assembly according to claim 1, wherein n=4.

5. The mask assembly of claim 4, wherein the same tensile force of each of the at least n evaporation masks is 5.8 N, and the widths of the mask regions of the evaporation masks corresponding to the n types of display panels with different sizes are 73.77 mm, 72.50 mm, 72.90 mm, and 72.35 mm respectively.

6. The mask assembly according to claim 1, wherein the width ranges from 73.77 mm to 74.27 mm.

7. The mask assembly according to claim 1, wherein the at least n evaporation masks are fine metal masks.

8. The mask assembly according to claim 1, further comprising a mask frame, wherein the foothold mask and the at least n evaporation masks are disposed on the mask frame.

9. The mask assembly according to claim 1, wherein each of the mask regions is provided with a plurality of evaporation holes, a density of the plurality of evaporation holes is equal to a density of sub-pixels of a display panel corresponding to the each of the at least n evaporation masks, each of the plurality of evaporation holes is configured to manufacture a sub-pixel of the display panel corresponding to the each of the at least n evaporation masks, a size of the plurality of evaporation holes is equal to a size of a corresponding sub-pixel among the sub-pixels.

10. A method for manufacturing a mask assembly, wherein the mask assembly is the mask assembly according to claim 1, the method comprising:
    manufacturing at least n evaporation masks, wherein the at least n evaporation masks have a same width and the at least n evaporation masks respectively correspond to n types of display panels with different sizes, the width matching the n types of display panels with different sizes and n being an integer greater than 2; and
    obtaining the mask assembly based on the at least n evaporation masks.

11. The method according to claim 10, wherein manufacturing the at least n evaporation masks comprises:
    acquiring n initial widths by determining an initial width corresponding to each display panel of the n types of display panels with different sizes based on a width of each of the display panels; and
    determining a maximum value of the n initial widths as the width of the at least n evaporation masks.

12. The method according to claim 10, wherein
    each of the mask regions is provided with a plurality of evaporation holes, a density of the plurality of evaporation holes is equal to a density of sub-pixels of a display panel corresponding to each of the at least n evaporation masks, each of the plurality of evaporation holes is configured to manufacture a sub-pixel of the display panel corresponding to the each of the at least n evaporation masks, and a size of the plurality of evaporation holes is equal to a size of a corresponding sub-pixel among the sub-pixels.

13. The method according to claim 10, further comprising:
    manufacturing a foothold mask comprising a plurality of opening areas; and
    obtaining the mask assembly based on the at least n evaporation masks comprises: obtaining the mask assembly by laminating the at least n evaporation masks and the foothold mask, wherein in the mask assembly, the at least n evaporation masks are disposed on a same layer, the opening areas of the foothold mask respectively correspond to mask regions of the at least n evaporation masks, and a shape and a size of the opening area match those of a corresponding mask region among the mask regions.

14. The method according to claim 13, further comprising:
    manufacturing a mask frame; and
    laminating the at least n evaporation masks and the foothold mask comprises: disposing the foothold mask and the at least n evaporation masks on the mask frame, such that the at least n evaporation masks are disposed on the same layer, and the at least n evaporation masks and the foothold mask are laminated.

15. A display device, wherein at least one film layer in the display device is manufactured by using the mask assembly according to claim 1.

* * * * *